US011923378B2

(12) United States Patent
Kao et al.

(10) Patent No.: US 11,923,378 B2
(45) Date of Patent: Mar. 5, 2024

(54) ELECTRONIC DEVICE

(71) Applicant: InnoLux Corporation, Miao-Li County (TW)

(72) Inventors: Chi-Lun Kao, Miao-Li County (TW); Ker-Yih Kao, Miao-Li County (TW); Ming-Chun Tseng, Miao-Li County (TW); Kung-Chen Kuo, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/111,606

(22) Filed: Feb. 20, 2023

(65) Prior Publication Data
US 2023/0207574 A1    Jun. 29, 2023

Related U.S. Application Data

(62) Division of application No. 16/885,308, filed on May 28, 2020, now Pat. No. 11,616,084.

(60) Provisional application No. 62/867,899, filed on Jun. 28, 2019.

(30) Foreign Application Priority Data

Mar. 13, 2020  (CN) .......................... 202010174846.2

(51) Int. Cl.
*H01L 27/12*     (2006.01)
*H01L 23/60*     (2006.01)
*H01L 25/16*     (2023.01)
*H01L 27/02*     (2006.01)

(52) U.S. Cl.
CPC ............ *H01L 27/124* (2013.01); *H01L 23/60* (2013.01); *H01L 25/167* (2013.01); *H01L 27/0292* (2013.01)

(58) Field of Classification Search
USPC .......................................... 257/72
See application file for complete search history.

(56) References Cited

U.S. PATENT DOCUMENTS

2004/0183978 A1* 9/2004 Jeoung ............ G02F 1/134363
                                                   349/141
2007/0126969 A1* 6/2007 Kimura ............ G02F 1/134363
                                                   349/141

* cited by examiner

*Primary Examiner* — Bo B Jang
(74) *Attorney, Agent, or Firm* — Winston Hsu

(57) ABSTRACT

The present disclosure provides an electronic device including a substrate, a common electrode, and a plurality of pixels. The common electrode is disposed on the substrate. The pixels are disposed on the substrate, and at least one of the pixels includes a thin film transistor, a first electrode, a second electrode, and an auxiliary electrode. The first electrode is electrically connected to the thin film transistor. The auxiliary electrode is partially overlapped with the first electrode in a top view direction of the electronic device. The auxiliary electrode is electrically connected to the common electrode and electrically isolated from the first electrode, and the first electrode and the auxiliary electrode have a minimum distance less than a minimum distance between the first electrode and the common electrode.

5 Claims, 8 Drawing Sheets

ELECTRONIC DEVICE

CROSS REFERENCE TO RELATED APPLICATIONS

This application is a division of U.S. application Ser. No. 16/885,308, filed on May 28, 2020, which claims the benefit of U.S. Provisional Application No. 62/867,899, filed on Jun. 28, 2019. The contents of these applications are incorporated herein by reference.

BACKGROUND OF THE DISCLOSURE

1. Field of the Disclosure

The present disclosure relates to an electronic device, and more particularly to an electronic device in which an auxiliary electrode is disposed in a pixel.

2. Description of the Prior Art

With the advance of technology, electronic devices with display function have been developed to have properties of light weight, low power consumption, no radiation pollution, etc., such that the electronic devices may be widely applied in various levels of products in everyday life, for example applied in modern information apparatus, such as television, note book, laptop computer, mobile phone, smart phone, etc. In conventional electronic devices, it is required to have many thin-film transistors for controlling the display of the pixels. However, during manufacturing the electronic device or when the manufacture is completed, a lot of electrostatic charges may exist, for example the electrostatic charges accumulated on manufacturing machines or tools or on devices to be disposed on the thin-film transistors. Accordingly, electrical characteristics of the thin-film transistors may be shifted or the thin-film transistors may be damaged due to the electrostatic discharge (ESD), resulting in poor display of the electronic device.

SUMMARY OF THE DISCLOSURE

An embodiment of the present disclosure provides an electronic device including a substrate, a common electrode, and a plurality of pixels. The common electrode is disposed on the substrate. The pixels are disposed on the substrate, and at least one of the pixels includes a thin film transistor, a first electrode, a second electrode, and an auxiliary electrode. The first electrode is electrically connected to the thin film transistor. The auxiliary electrode is partially overlapped with the first electrode in a top view direction of the electronic device. The auxiliary electrode is electrically connected to the common electrode and electrically isolated from the first electrode, and the first electrode and the auxiliary electrode has a minimum distance less than a minimum distance between the first electrode and the common electrode.

These and other objectives of the present disclosure will no doubt become obvious to those of ordinary skill in the art after reading the following detailed description of the embodiment that is illustrated in the various figures and drawings.

DETAILED DESCRIPTION

Figure 1A:
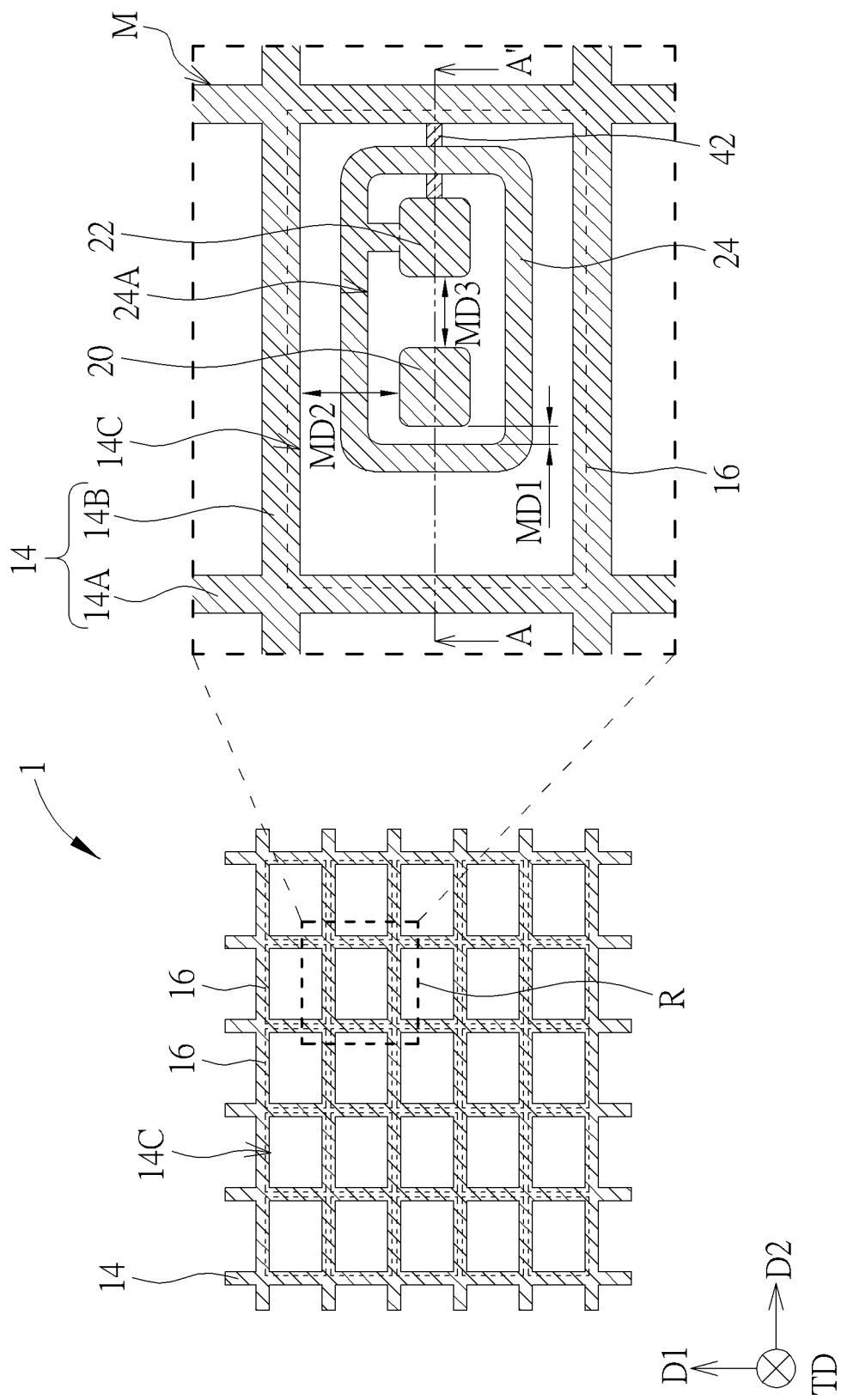
FIG. 1A schematically illustrates a top view of an electronic device according to a first embodiment of the present disclosure.

The present disclosure may be understood by reference to the following detailed description, taken in conjunction with the drawings as described below, and for purposes of illustrative clarity and being easily understood by the readers, various drawings of this disclosure may be simplified, and the elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "comprise", "include" and "have" are used in an open-ended fashion, and thus should be interpreted to mean "include, but not limited to . . . ".

The direction terms used in the following embodiments such as up, down, left, right, in front of or behind are only the directions referring to the attached figures. Thus, the direction terms used in the present disclosure are for illustration, and are not intended to limit the scope of the present disclosure. It should be noted that the elements which are specifically described or labeled may exist in various forms for those skilled in the art. Besides, when a layer is referred to as being "on" another element or layer, or is referred to as being "connected" to another element or layer, it may be directly on or connected to the other element or layer, or intervening layers or elements may be included between the layer and the other element or layer (indirectly). In contrast, when an element or layer is referred to as being "directly on" or "directly connected to" another element or layer, there are no intervening elements or layers present.

The ordinal numbers such as "first", "second", etc. are used in the specification and claims to modify the elements in the claims. It does not mean that the required element has any previous ordinal number, and it does not represent the order of a required element and another required element or the order in the manufacturing method. The ordinal number is only used to distinguish the required element with a certain name and another required element with the same certain name.

It should be noted that the technical features in different embodiments described in the following may be replaced, recombined, or mixed with one another to constitute another embodiment without departing from the spirit of the present disclosure.

The electronic device of the present disclosure may include display device, light emitting device, antenna device, sensing device, touch electronic device (touch display), curved electronic device (curved display) or non-rectangular electronic device (free shape display), but not limited thereto. The electronic device may include foldable electronic device or flexible electronic device. The electronic device may for example include light-emitting diode (LED), fluorescence, phosphor, other suitable display medium or combinations thereof, but not limited thereto. For instance, the LED may include organic LED (OLED), mini LED, micro LED or quantum dot LED (QLED or QDLED), other suitable material or any combination thereof, but not limited thereto. The display device of an example may be a tiled display device, but is not limited thereto. The antenna device may for example be a liquid crystal antenna, but not limited thereto. Also, outer shape of the electric device may be rectangular, circular, polygonal, shape with curved edge or other suitable shapes. The electronic device may include peripheral system, such as driving system, control system, light source system, frame system, etc., for supporting the display device or tiled device. It should be noted that the electronic device may be combinations of the above-mentioned electronic devices, but not limited thereto. The electronic device as mentioned herein takes the display device as an example to detail the content of the present disclosure, but the present disclosure is not limited thereto.

Figure 1B:
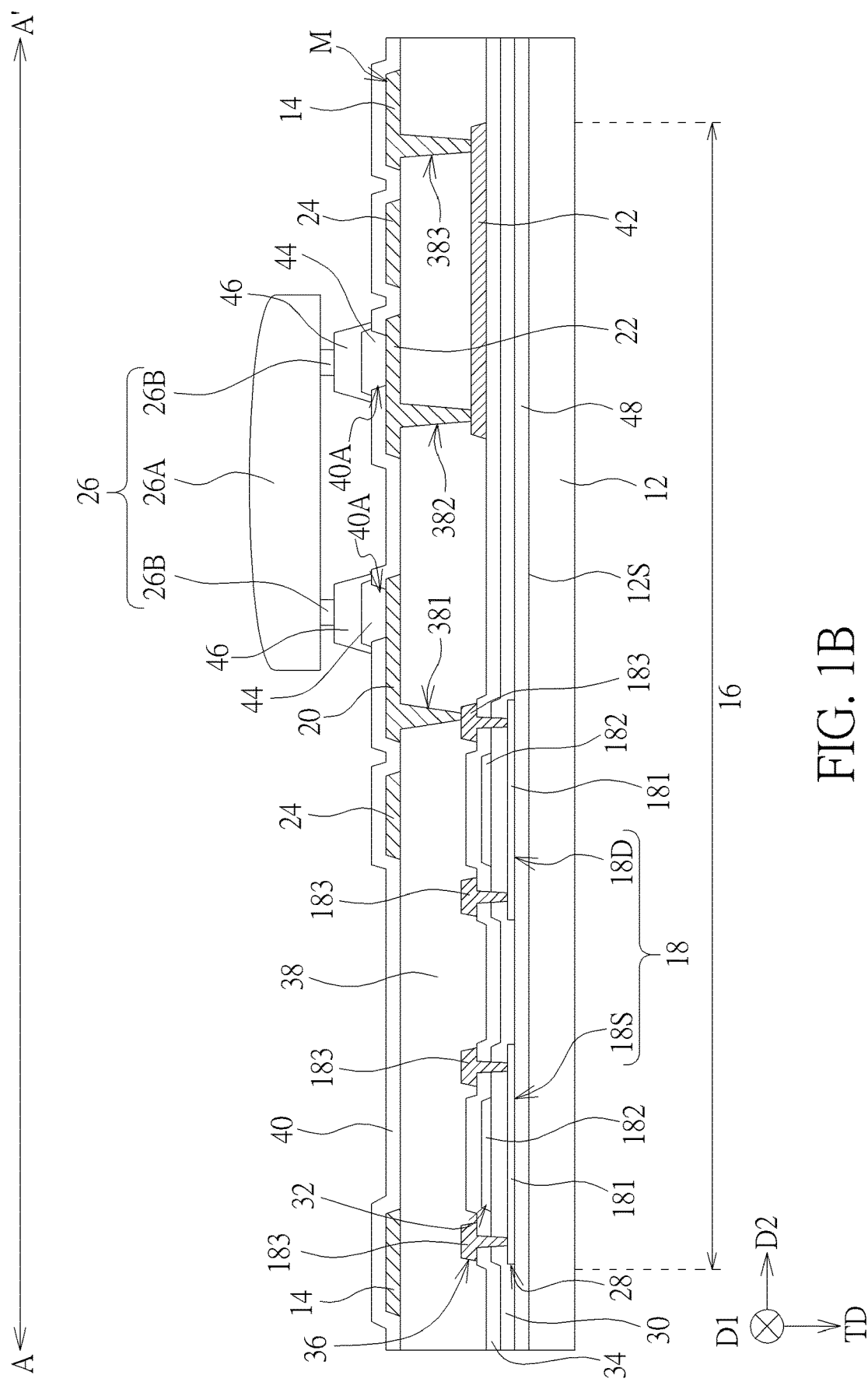
FIG. 1B schematically illustrates a cross-sectional view taken along a line A-A' of FIG. 1.

FIG. 1A schematically illustrates a top view of an electronic device according to a first embodiment of the present disclosure, and FIG. 1B schematically illustrates a cross-sectional view taken along a line A-A' of FIG. 1. For clearly showing the technical features of the present disclosure, FIG. 1A mainly illustrates a common electrode and a relationship between a first electrode and a second electrode in one pixel, and a right portion of FIG. 1A schematically depicts an enlarged view of a region R in a left portion of FIG. 1A, but the present disclosure is not limited thereto. As shown in FIG. 1A and FIG. 1B, the electronic device 1 includes a substrate 12, a common electrode 14, and a plurality of pixels 16, in which the common electrode 14 and the pixels 16 may be disposed on a top surface 12S of the substrate 12. The substrate 12 may for example include flexible substrate or inflexible substrate. The material of the substrate 12 may include for instance glass, ceramic, quartz, sapphire, acrylic, polyimide (PI), polyethylene terephthalate (PET), polycarbonate (PC), polyethersulfone (PES), polybutylene terephthalate (PBT), polyethylene naphthalate (PEN), polyarylate (PAR), other suitable materials or combinations thereof, but the present disclosure is not limited thereto.

As shown in FIG. 1A, as viewed along a top view direction TD of the electronic device 1, the common electrode 14 may include strip portions 14A extending along a first direction D1 and strip portions 14B extending along a second direction D2, and the strip portions 14A may cross and be connected to the strip portions 14B, such that the common electrode 14 may be mesh-shaped. The common electrode 14 may include a plurality of first openings 14C, and as viewed along the top view direction TD, the plurality of pixels 16 may be disposed in the plurality of first openings 14C. For example, at least one pixel 16 may be disposed in one first opening 14C. Taking the embodiment shown in FIG. 1A as an example, one pixel 16 may be disposed one first opening 14C, but is not limited thereto. In some embodiments, there may be at least two pixels 16 disposed in one first opening 14C. In some embodiments, the pixel 16 may be for example a sub-pixel for generating single color or a pixel for generating plural colors, but is not limited thereto. The top view direction TD of the present disclosure may for example be a normal direction perpendicular to the top surface 12S of the substrate 12 shown in FIG. 1B. The first direction D1 and the second direction D2 may be perpendicular to the top view direction TD, and for example be perpendicular to each other, but are not limited thereto. The common electrode 14 may be used for guiding or eliminating electrostatic charges. As an example, the common electrode 14 may be electrically connected to a ground voltage or a common voltage after the electronic device 1 is manufactured, but is not limited thereto. The ground voltage and the common voltage may be same or different.

Please continue referring to FIG. 1A and FIG. 1B. At least one pixel 16 may include a thin-film transistor 18, a first electrode 20, a second electrode 22, and an auxiliary electrode 24, in which the first electrode 20 is electrically connected to the thin-film transistor 18, and the auxiliary electrode 24 is electrically connected to the common electrode 14 and electrically isolated from the first electrode 20. It should be noted that the first electrode 20 and the auxiliary electrode 24 have a minimum distance MD1 therebetween, and the minimum distance MD1 is less than a minimum distance MD2 between the first electrode 20 and the common electrode 14, such that plenty of electrostatic charges flowing into the first electrode 20 may be discharged to the common electrode 14 with larger area through the auxiliary electrode 24, thereby mitigating damage to the thin-film transistor 18 by the ESD. Accordingly, ESD protection of the electronic device 1 may be improved.

In the embodiment of FIG. 1A and FIG. 1B, the auxiliary electrode 24, the first electrode 20 and the second electrode 22 may be formed in the same layer (such as a conductive layer M). In the present disclosure, "formed in the same layer" may refer to include the same material, formed by the same process, formed of the same layer or both sandwiched between the same two layers (such as between planarization layer 38 and insulation layer 40 shown in FIG. 1B). Besides, in the top view direction TD of the electronic device 1, the auxiliary electrode 24 may surround the first electrode 20, so as to be disposed between the first electrode 20 and the common electrode 14, and accordingly, the minimum distance MD1 between the first electrode 20 and the auxiliary electrode 24 may be located in a horizontal direction perpendicular to the top view direction TD, but is not limited thereto. In other words, as viewed along the top view direction TD of the electronic device 1, the auxiliary electrode 24 may include at least one second opening 24A, and the first electrode 20 is disposed in the second opening 24A. In the embodiment of FIG. 1A, the minimum distance MD1 may be located in the first direction D1, but not limited thereto. In some embodiments, the minimum distance MD1 may be located in the second direction D2 or other horizontal direction different from the first direction D1 and the second direction D2. In some embodiments, in the top view direction TD of the electronic device 1, the auxiliary electrode 24 may surround the first electrode 20 and the second electrode 22 and be located between the second electrode 22 and the common electrode 14; that is, the first electrode 20 and the second electrode 22 may be located in the second opening 24A, but is not limited thereto. In some embodiments, the auxiliary electrode 24 may surround the first electrode 20 and may not surround the second electrode 22. In some embodiments, the auxiliary electrode 24 may not surround the first electrode 20 and may be disposed on at least one side of the first electrode 20. In some embodiments, the minimum distance MD1 between the first electrode 20 and the auxiliary electrode 24 may also be less than a minimum distance MD3 between the first electrode 20 and the second electrode 22, so as to reduce the electrostatic charges flowing into the second electrode 22. In some embodiments, the minimum distance MD1 between the first electrode 20 and the auxiliary electrode 24, the minimum distance MD2 between the first electrode 20 and the common electrode 14 and the minimum distance MD3 between the first electrode 20 and the second electrode 22 may be obtained by measuring the minimum distance between two electrodes mentioned above when viewed along the top view direction TD, or by measuring the minimum distance between two electrodes mentioned above along a cross-sectional direction, but the present disclosure is not limited thereto. For example, in the situation that the minimum distance is measured along the cross-sectional direction, when the minimum distance is measured along the cross-sectional direction, the minimum distance between two electrodes that are formed in different layers may be measured along the second direction D2 or along the first direction D1.

In the embodiment of FIG. 1A, the second electrode 22 may be electrically connected to the auxiliary electrode 24, but is not limited thereto. For instance, the second electrode 22 may be directly connected to the auxiliary electrode 24, but is not limited herein. In some embodiments, the second electrode 22 may be electrically connected to the auxiliary electrode 24 through a wire formed by a conductive layer different from the conductive layer M (such as the wire 350 shown in FIG. 3A). In the embodiment of FIG. 1A, the common electrode 14 and the first electrode 20 may be formed in the same conductive layer M, and as viewed along the top view direction TD of the electronic device 1, the first electrode 20, the second electrode 22 and the auxiliary electrode 24 may be located in the first opening 14C and separated from the common electrode 14. In such situation, the pixel 16 may further include a wire 42 formed in a conductive layer different from the conductive layer M, and the wire 42 may be electrically connected to the second electrode 22 and the common electrode 14, such that the auxiliary electrode 24 may be electrically connected to the common electrode 14 through the second electrode 22 and the wire 42. In some embodiments, the auxiliary electrode 24 may be directly connected to the common electrode 14, or when the second electrode 22 is electrically connected the auxiliary electrode 24, the second electrode 22 may be directly connected to the common electrode 14 without the wire 42. In some embodiments, the auxiliary electrode 24 and the second electrode 22 may be electrically isolated from each other and be separated from each other. In such situation, voltage (such as the common voltage) provided to the auxiliary electrode 24 and the common electrode 14 may be different from voltage (such as the ground voltage) provided to the second electrode 22, but is not limited thereto. In some embodiments, the common electrode 14, the auxiliary electrode 24, the first electrode 20 and the second electrode 22 may respectively include conductive material, and the conductive material may for example include aluminum, molybdenum nitride, copper, titanium, other suitable materials or combinations thereof, but not limited thereto.

In detail, in the embodiment of FIG. 1A and FIG. 1B, the electronic device 1 takes a self-emissive display device as an example, in which one pixel 16 may include at least two thin-film transistors 18 and at least one light-emitting element 26, but the present disclosure is not limited thereto. The number of the thin-film transistors 18 and the number of the light-emitting element 26 in the pixel 16 are not limited to be shown in FIG. 1B and may be altered based on demands. It is noted that the range of single pixel 16 may be defined by a distribution range of elements included in the pixel 16. Taking FIG. 1B as an example, the range of the pixel 16 may be from outer side of the outmost thin-film transistor 18 to an outer side of the wire 42, but is not limited thereto. One of the thin-film transistors 18 may be a switch element 18S, another one of the thin-film transistors 18 may be a driving element 18D, and the light-emitting element 26 may be electrically connected to the driving element 18D through the first electrode 20. In some embodiments, the positions of the switch element 18S and the driving element 18D and the electrical relationship among the switch element 18S, the driving element 18D and the first electrode 20 may be adjusted based on the circuit designs.

In some embodiments, the light-emitting element 26 may include light-emitting body 26A and two conductive pads 26B, in which the light-emitting body 26A may be used for generating light, and the conductive pads 26B are disposed on bottom surfaces of the light-emitting body 26A and used for electrically connecting the light-emitting body 26A to the first electrode 20 and the second electrode 22 respectively. The conductive pads 26B may be disposed on the first electrode 20 and the second electrode 22 respectively, and the conductive pads 26B may be electrically connected to the first electrode 20 and the second electrode 22 respectively. As an example, the light-emitting element 26 may include LED package, LED chip or other suitable light-emitting elements. The LED package or the LED chip may for example include an organic LED, a mini LED, a micro LED, quantum dot LED, nano-wire LED or quantum rod LED, but is not limited thereto. The LED package may for example include one or more LED chip. The first electrode 20 and the second electrode 22 may be electrically connected to anode and cathode of the light-emitting element 26 respectively, but not limited thereto. In some embodiments, the first electrode 20 and the second electrode 22 may be electrically connected to the cathode and anode of the light-emitting element 26 respectively. In some embodiments, the electronic device 1 may include for example organic LED display device or non-self-emissive display device, but not limited thereto. The non-self-emissive display device may include for example liquid crystal display device, but not limited thereto.

In some embodiments, as shown in FIG. 1B, when the thin-film transistor 18 is top-gate type, the electronic device 1 may include a semiconductor layer 28, an insulation layer 30, a conductive layer 32, an insulation layer 34, a conductive layer 36, and a planarization layer 38, but is not limited thereto. In such situation, the semiconductor layer 28 may be disposed on the substrate 12 and include a channel layer 181 of the thin-film transistor 18; the insulation layer 30 may be disposed on the semiconductor layer 28 and the substrate 12 and be regarded as a gate insulation layer of the thin-film transistor 18; the conductive layer 32 may be disposed on the insulation layer 30 and include a gate 182 of the thin-film transistor 18; the insulation layer 34 may be disposed on the conductive layer 32 and the insulation layer 30; the conductive layer 36 may be disposed on the insulation layer 34 and include source/drains 183 of the thin-film transistor 18, and the source/drains 183 are electrically connected to the channel layer 181 via through holes of the insulation layer 34 and the insulation layer 30; and the planarization layer 38 may be disposed on the conductive layer 36 and the insulation layer 34. The planarization layer 38 may include a through hole 381, such that the first electrode 20 may be electrically connected to one of the source/drains 183 of the corresponding thin-film transistor 18 via the through hole 381. In the embodiment of FIG. 1B, the common electrode 14, the auxiliary electrode 24, the first electrode 20 and the second electrode 22 are disposed on the planarization layer 38, but are not limited thereto. In one embodiment, as shown in FIG. 1B, the electronic device 1 may further include a passivation layer 40 disposed on the common electrode 14, the auxiliary electrode 24, the first electrode 20, the second electrode 22 and the planarization layer 38 and used for protecting the common electrode 14, the auxiliary electrode 24, the first electrode 20 and the second electrode 22. The passivation layer 40 may include two openings 40A respectively exposing the first electrode 20 and the second electrode 22, such that the first electrode 20 and the second electrode 22 may be electrically connected to the conductive pads 26B of the light-emitting element 26 through the openings 40A respectively.

In some embodiments, the conductive layer 32 and the conductive layer 36 may include conductive material respectively, and the conductive material for example include aluminum, molybdenum nitride, copper, titanium, other suitable materials or combinations thereof, but not limited thereto. The insulation layer 30, the insulation layer 34 and the passivation layer 40 may respectively include for example silicon oxide, silicon nitride, other suitable materials or combinations thereof, but not limited thereto. The planarization layer 38 may include for example acrylic-based organic material, silicon-based organic material, other suitable organic materials or combinations thereof, but not limited thereto.

The type of thin-film transistor 18 in the present disclosure is not limited to be the top-gate type shown in FIG. 1B, and in some embodiments, the thin-film transistor 18 may be for example a bottom-gate type transistor, or may be a dual-gate type transistor or other suitable transistors depending on requirements. Alternatively, the thin-film transistor 18 may include for example amorphous silicon transistor, low-temperature poly-silicon (LTPS) transistor, metal-oxide semiconductor (IGZO) transistor, but is not limited thereto. According to the type of the thin-film transistor 18, the number of the insulation layers in the electronic device 1 may be altered. In some embodiments, different thin-film transistors 18 may include the semiconductor layers 28 of different materials, but not limited thereto.

In the embodiment of FIG. 1A and FIG. 1B, besides the through hole 381, the planarization layer 38 may further include a through hole 382 and a through hole 383, and the wire 42 may be disposed between the planarization layer 38 and the insulation layer 34, such that the second electrode 22 may be electrically connected to the wire 42 via the through hole 382, and the common electrode 14 may be electrically connected to the wire 42 via through hole 383. Accordingly, the electrical connection between the auxiliary electrode 24 and the common electrode 14 may be achieved. For example, the wire 42 may be formed in the conductive layer 36, the conductive layer 32 or other conductive layer different from the conductive layer M, but is not limited thereto. The electrical connection from the auxiliary electrode 24 to the common electrode 14 in the present disclosure is not limited to the mentioned above. In some embodiments, when the common electrode 14 and the second electrode 22 are formed in the same conductive layer M, the auxiliary electrode 24 may be formed in the conductive layer 36 or located in any conductive layer on the conductive layer 36. In some embodiments, when the auxiliary electrode 24 and the second electrode 22 are formed in the same conductive layer M, the common electrode 14 may be formed in a conductive layer different from the conductive layer M. For example, the common electrode 14 may be formed in the conductive layer 36, but not limited thereto.

It is noted that when the thin-film transistor 18 is not operated yet, the channel layer 181 of the thin-film transistor 18 has a certain resistance, and by means of disposing the auxiliary electrode 24 to be adjacent to the first electrode 20, plenty of electrostatic charges in the first electrode 20 may be discharged to the common electrode 14 through the auxiliary electrode 24, so as to mitigate the damage to the structure of the thin-film transistor 18 (such as the channel layer 181), thereby improving the ESD protection of the electronic device 1.

In some embodiments, as shown in FIG. 1B, the pixel 16 may optionally further include at least two pads 44 disposed on the insulation layer 40, and the pads 44 are electrically connected to the first electrode 20 and the second electrode 22 respectively through the openings 40A. The conductive pads 26B of the light-emitting element 26 may be bonded to the first electrode 20 and the second electrode 22 through the pads 44 respectively, but are not limited thereto. In some embodiments, the pixel 16 may optionally include conductive material for adhering and electrically connecting the conductive pads 26B to the corresponding pads 44. For example, the conductive material may include solder ball, but is not limited thereto. In some embodiments, the conductive pads 26B may be directly bonded to the corresponding pads 44 through eutectic bonding or other suitable bonding method only if the conductive pads 26B can be electrically connected to the corresponding pads 44.

In some embodiments, as shown in FIG. 1B, the electronic device 1 may optionally further include a buffer layer 48 disposed between the thin-film transistor 18 and the substrate 12. The buffer layer 48 may for example be used for blocking moisture or oxygen from entering the electronic device 1. The buffer layer 48 may be single layer or multilayer. The material of the buffer layer 48 may include for example silicon nitride, silicon oxide, silicon oxynitride, aluminum oxide, resin, other suitable materials or combinations thereof, but not limited thereto.

The electronic device of the present disclosure is not limited to the above-mentioned embodiment and may include different embodiments or variant embodiments. In order to simplify the description, the elements of different embodiments and variant embodiments and the same element of the first embodiment will use the same label. In order to clearly describe different embodiments and variant embodiments, the following contents would focus on the difference between the first embodiment and different embodiments or variant embodiments, and the repeated portion will not be redundantly described.

Figure 2:
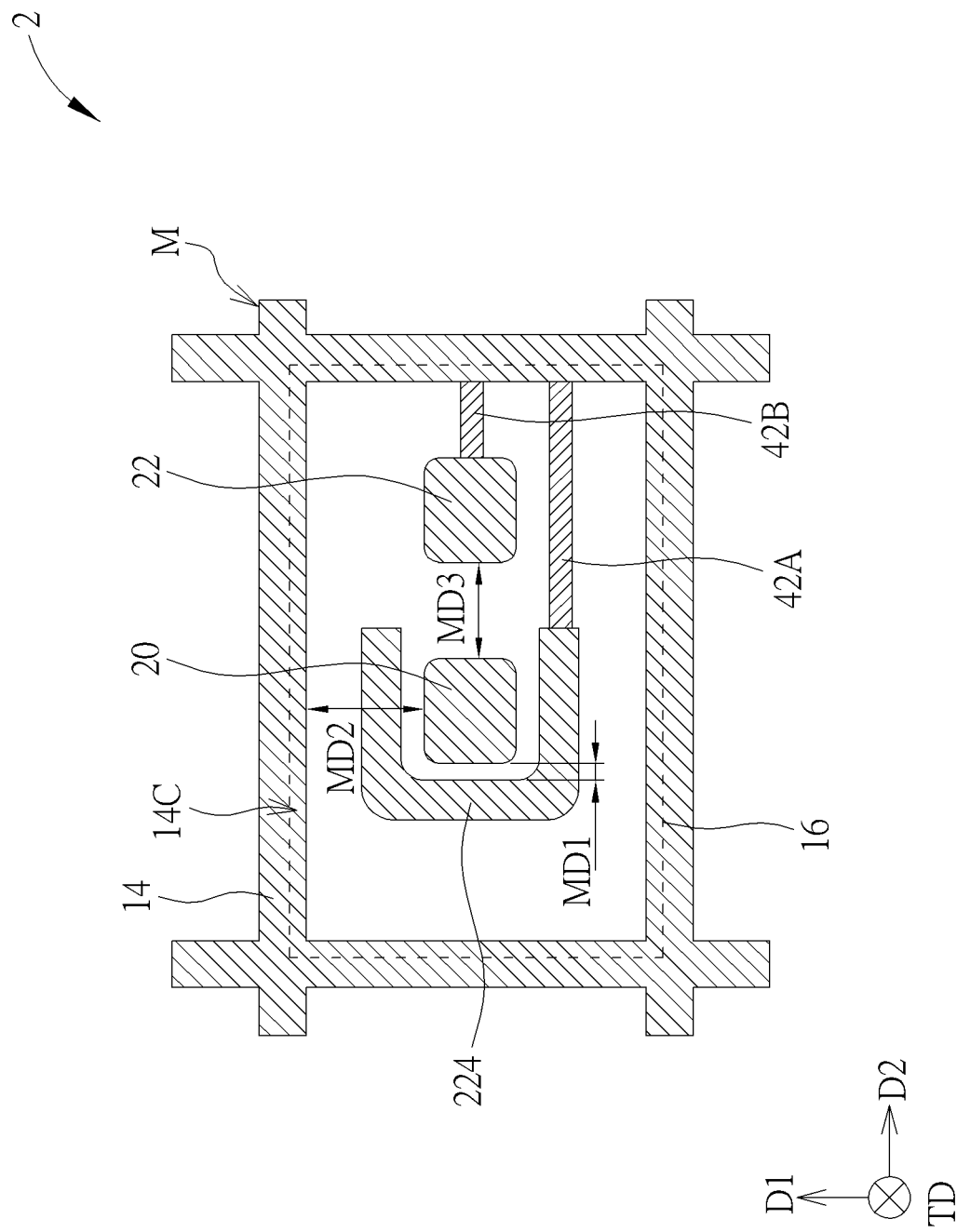
FIG. 2 schematically illustrates a top view of an electronic device according to a variant embodiment of the first embodiment of the present disclosure.

FIG. 2 schematically illustrates a top view of an electronic device according to a variant embodiment of the first embodiment of the present disclosure. For clearly showing the technical features of the present disclosure, FIG. 2 mainly illustrates a top view of the variant embodiment corresponding to the region R of FIG. 1, but the present disclosure is not limited thereto. In the embodiment of FIG. 2, the auxiliary electrode 224 may not surround the first electrode 20. In some embodiments, the auxiliary electrode 224 and the second electrode 22 may be electrically connected to the common electrode 14 respectively through wire 42A and wire 42B different from each other. In some embodiments, the wire 42A and the wire 42B may be located in different layers. In some embodiments, the wire 42B may not be electrically connected to the common electrode 14, and the second electrode 22 may be electrically connected to ground through the wire 42B, such that the second electrode 22 and the common electrode 14 may be respectively electrically connected to the ground voltage and the common voltage different from each other.

Figure 3A:
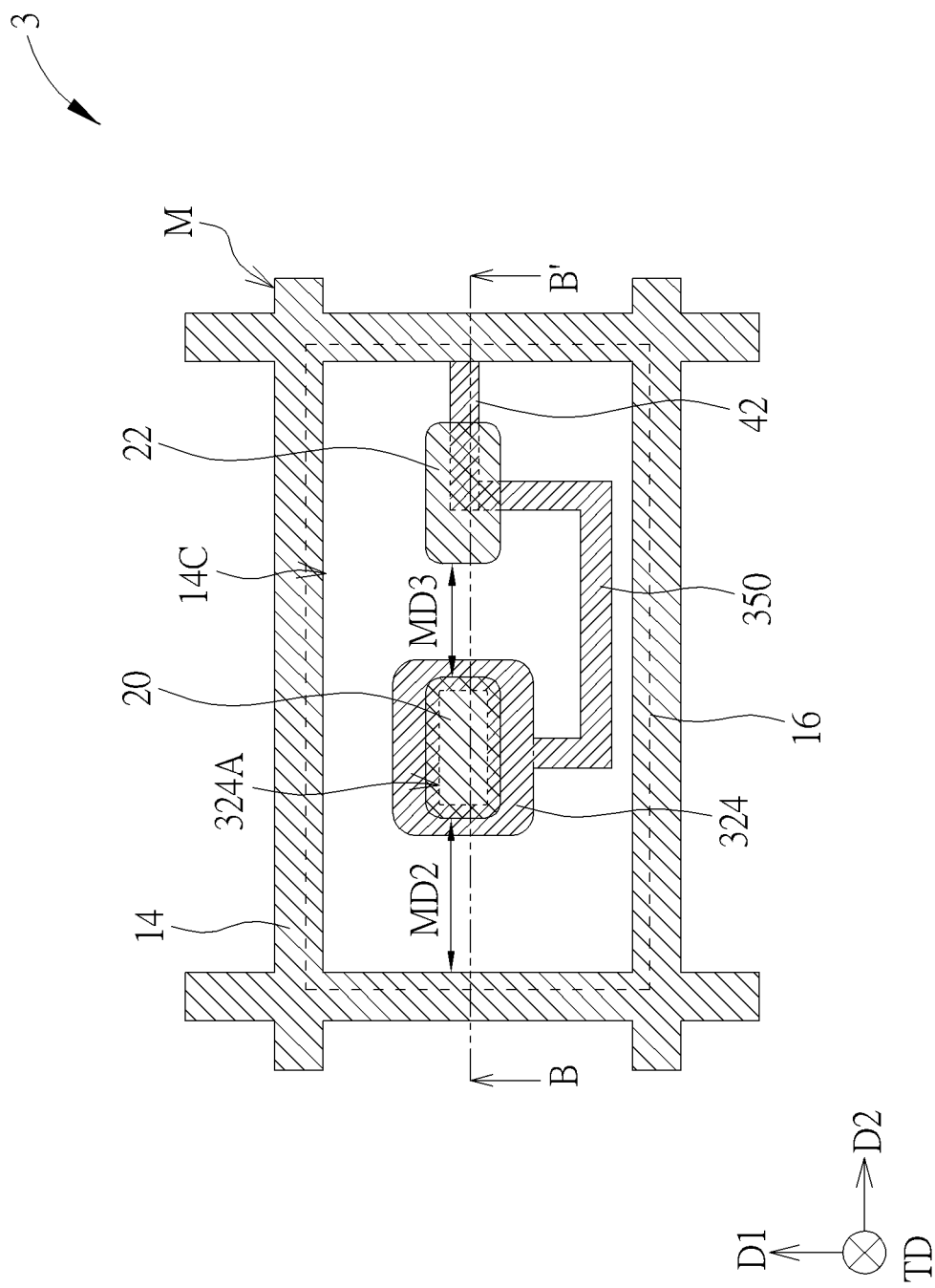
FIG. 3A schematically illustrates a top view of an electronic device according to a second embodiment of the present disclosure.
Figure 3B:
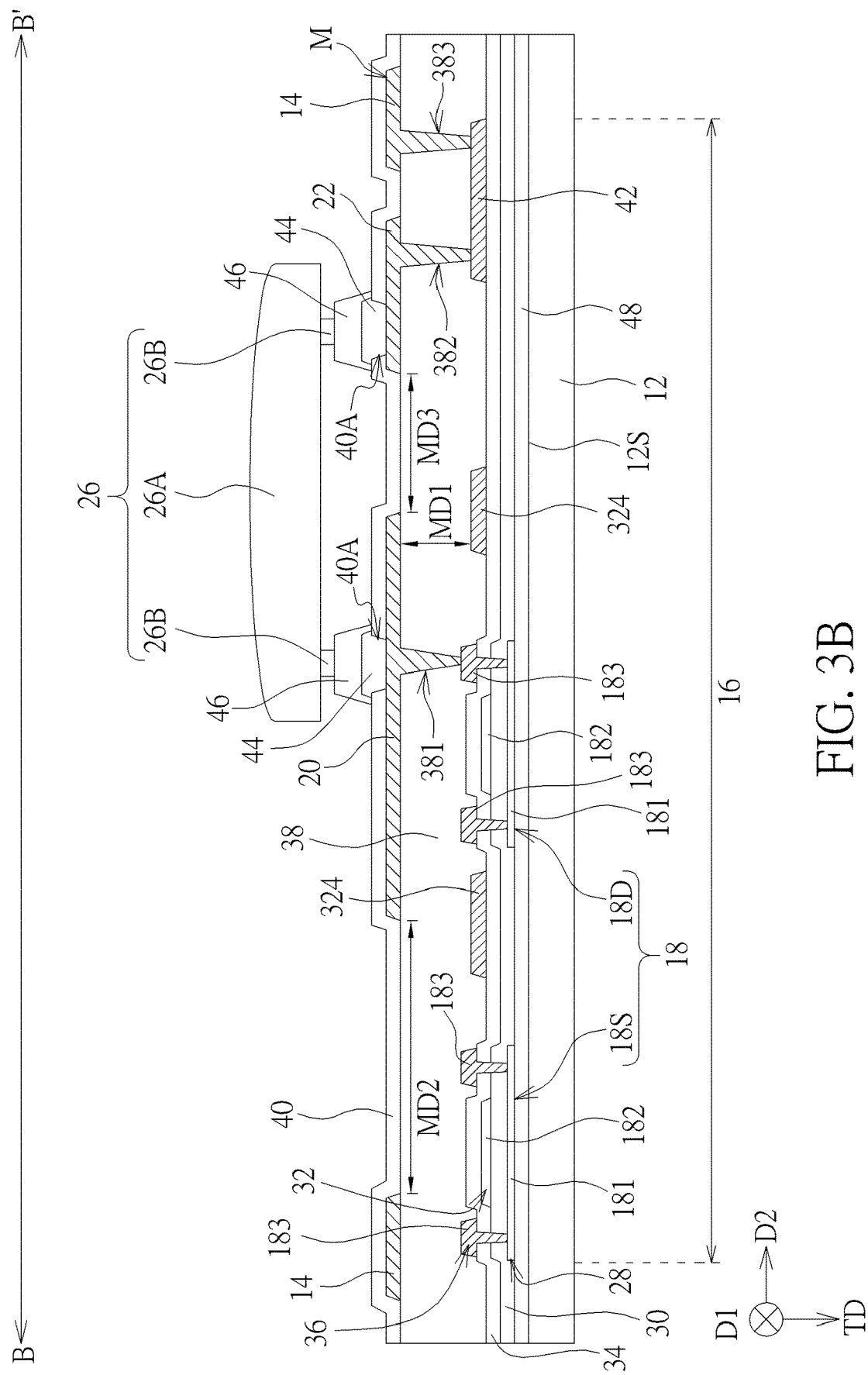
FIG. 3B schematically illustrates a cross-sectional view taken along a line B-B' of FIG. 3A.

FIG. 3A schematically illustrates a top view of an electronic device according to a second embodiment of the present disclosure, and FIG. 3B schematically illustrates a cross-sectional view taken along a line B-B' of FIG. 3A. For clearly showing the technical features of the present disclosure, FIG. 3A mainly illustrates a top view of the second embodiment corresponding to the region R of FIG. 1, but the present disclosure is not limited thereto. In the embodiment of FIG. 3A and FIG. 3B, the electronic device 3 is different from the previous embodiment in that the auxiliary electrode 324 is formed in the conductive layer different from the conductive layer M, and the auxiliary electrode 324 is partially overlapped with the first electrode 20 in the top view direction TD of the electronic device 3. In other words, the size of the second opening 324A of the auxiliary electrode 324 may be less than the area of the first electrode 20. For example, the auxiliary electrode 324 may be formed in the same layer as the conductive layer 36, but is not limited thereto. In some embodiments, the auxiliary electrode 324 may be disposed between the planarization layer 38 and the insulation layer 34 and be formed in the conductive layer different from the conductive layer 36. Accordingly, in the electronic device 3, the minimum distance MD1 may for example be located in the top view direction TD or located in a direction that is not parallel to the horizontal direction, but not limited thereto. In some embodiments, when the minimum distance between the source/drain 183 electrically connected to the first electrode 20 and the auxiliary electrode 324 may be less than the minimum distance between the auxiliary electrode 324 and the first electrode 20 in the situation that the minimum distance between the source/drain 183 and the auxiliary electrode 324 is within the range of limit of process machine for patterning, the minimum distance between the source/drain 183 and the auxiliary electrode 324 may be determined by the limit of the process machine.

As shown in FIG. 3A, in one embodiment, the pixel 16 may further include another wire 350 electrically connected to the wire 42. For example, the wire 42 may include a portion that is overlapped with the second electrode 22 in the top view direction TD of the electronic device 3, and the wire 350 may extend to be connected to the wire 42 (the portion overlapped with the second electrode 22), but is not limited thereto. In some embodiments, the wire 350 may extend to be overlapped with the common electrode 14, such that the auxiliary electrode 324 is electrically connected to the common electrode 14 through the wire 350. In some embodiments, in the top view direction TD of the electronic device 3, the auxiliary electrode 324 may not include second opening 324A, that is the auxiliary electrode 324 is at least not overlapped with a side of a portion of the first electrode 20; for example, the auxiliary electrode 324 may be U-shaped, and a side of a portion of the auxiliary electrode 324 may not be overlapped with the first electrode 20.

It should be noted that in the electronic device 3 shown in FIG. 3A and FIG. 3B, because the auxiliary electrode 324 that is electrically connected to the common electrode 14 with larger area is overlapped with the first electrode 20 in the top view direction TD of the electronic device 3 to increase coupling capacitor between the auxiliary electrode 324 and the first electrode 20, the coupling capacitor may facilitate the discharge of the electrostatic charges to the common electrode 14 when plenty of electrostatic charges flow into the first electrode 20, thereby improving the ESD protection of the electronic device 1.

Figure 4:
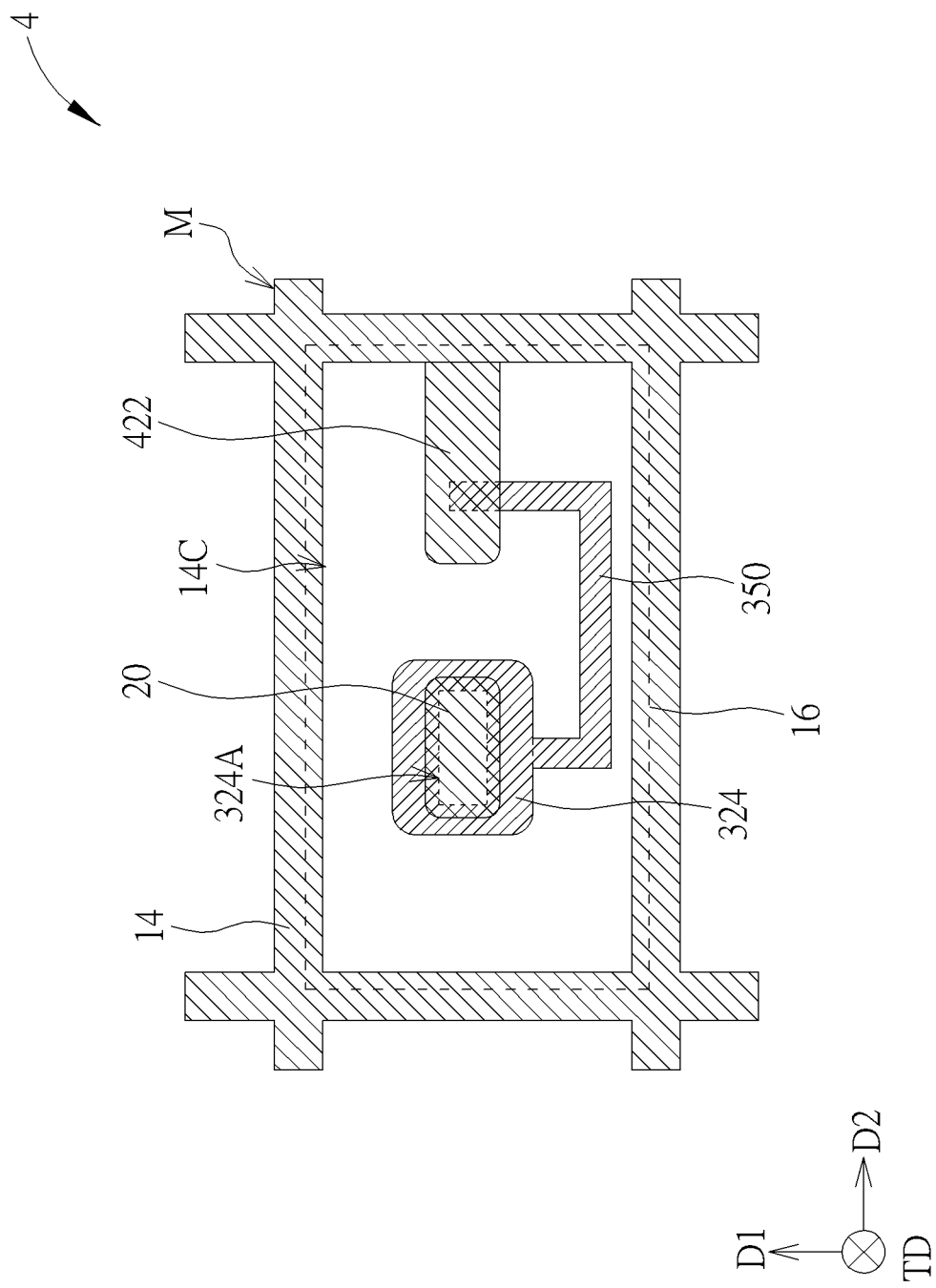
FIG. 4 schematically illustrates a top view of an electronic device according to a variant embodiment of the second embodiment of the present disclosure.

FIG. 4 schematically illustrates a top view of an electronic device according to a variant embodiment of the second embodiment of the present disclosure. For clearly showing the technical features of the present disclosure, FIG. 4 mainly illustrates a top view of the variant embodiment corresponding to the region R of FIG. 1, but the present disclosure is not limited thereto. In the variant embodiment of FIG. 4, the second electrode 422 may be directly connected to the common electrode 14, such that the electronic device 4 may not require the wire 42 shown in FIG. 3A.

Figure 5:
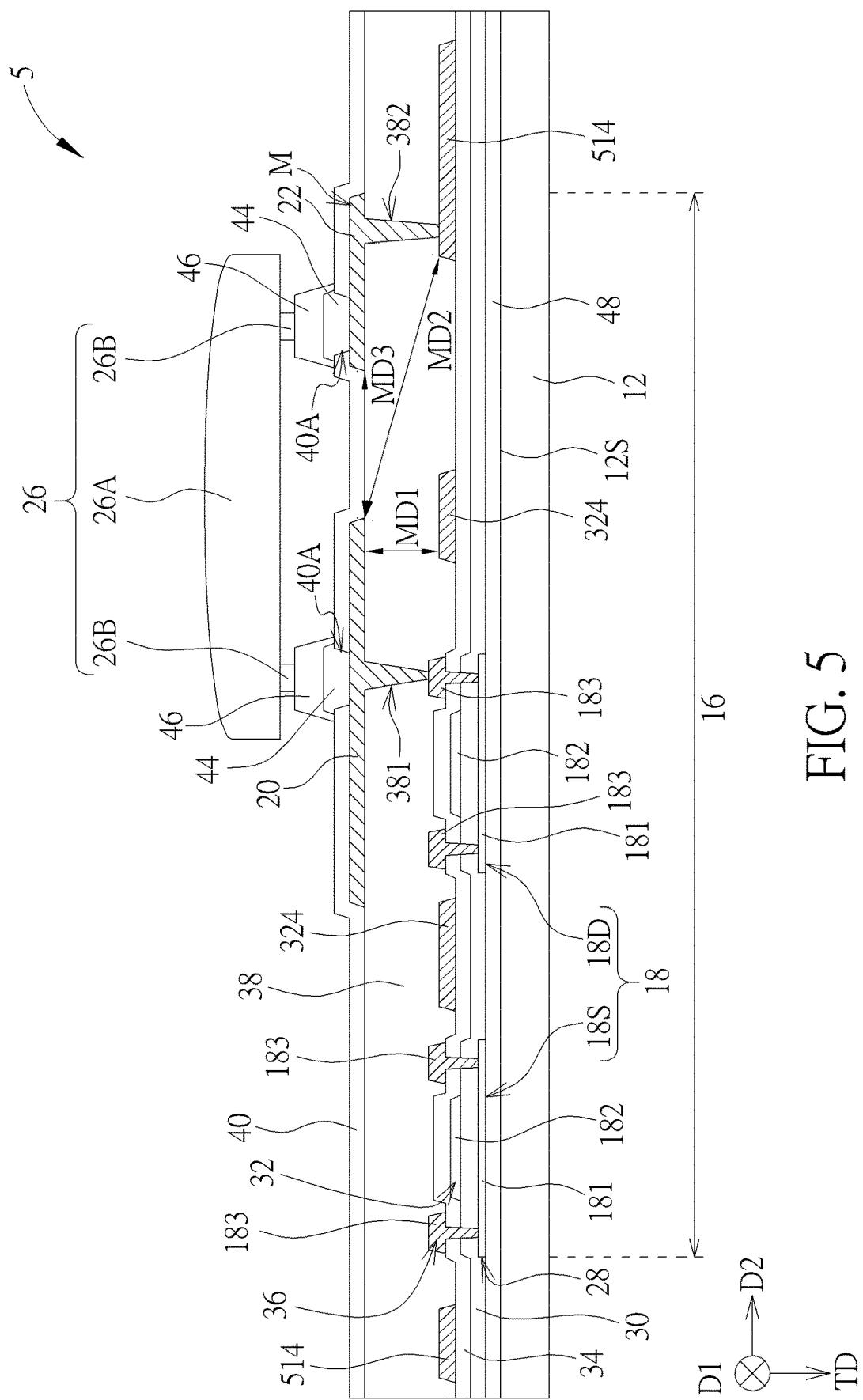
FIG. 5 schematically illustrates a top view of an electronic device according to another variant embodiment of the second embodiment of the present disclosure.

FIG. 5 schematically illustrates a top view of an electronic device according to another variant embodiment of the second embodiment of the present disclosure. The electronic device 5 of the present variant embodiment is different from the embodiment shown in FIG. 3B in that the common electrode 514 may be formed in a conductive layer different from the conductive layer M. For example, the common electrode 514 may be formed in the conductive layer 36, but not limited thereto. When the auxiliary electrode 324 is formed in the conductive layer 36, the auxiliary electrode 324 may be connected to the common electrode 514 directly through the wire 350 (as shown in FIG. 3A), but is not limited thereto. It is noted that during manufacturing the electronic device 5, the common electrode 514 is not electrically connected to the ground voltage or the common voltage yet, and the auxiliary electrode 324 and the common electrode 514 may be formed when the thin-film transistor 18 is manufactured, so that the common electrode 514 with larger area may facilitate the discharge of the electrostatic charges accumulated in the manufacturing processes to itself from the first electrode 20, thereby reducing damage of the electrostatic charges.

In some embodiments, besides the common electrode 514, the electronic device 5 may further include the common electrode 14 formed in the conductive layer M shown in FIG. 1B. In some embodiments, when the common electrode 514 is formed in the conductive layer 36, the auxiliary electrode may adopt the design of the auxiliary electrode 24 shown in FIG. 1B. In such situation, the auxiliary electrode 24 may be electrically connected to the common electrode 514 for example through the second electrode 22 and the wire 42, but not limited thereto.

Figure 6:
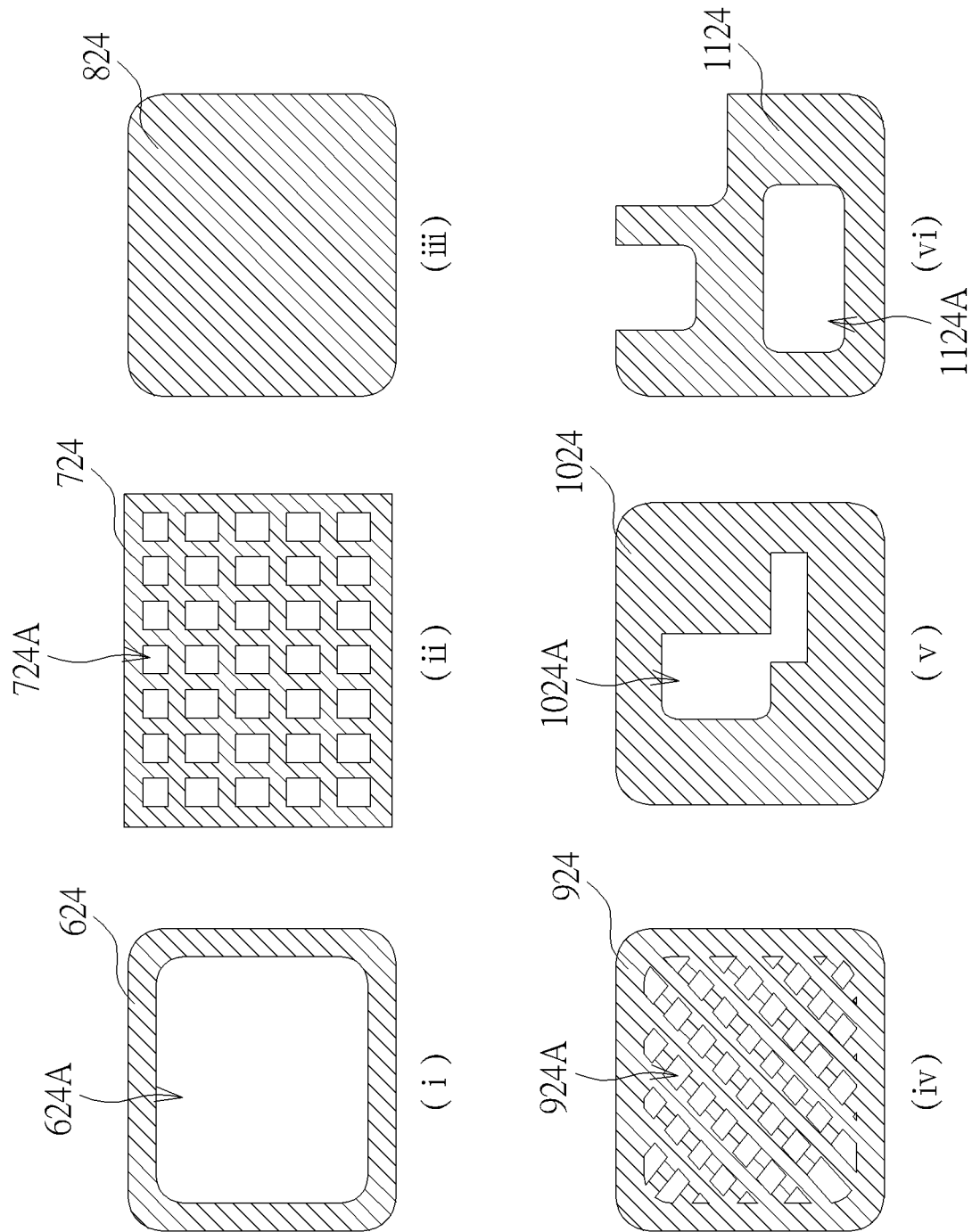
FIG. 6 schematically illustrates top views of auxiliary electrodes according to other variant embodiments of the present disclosure.

FIG. 6 schematically illustrates top views of auxiliary electrodes according to other variant embodiments of the present disclosure. For clearly showing the technical features of the present disclosure, FIG. 6 illustrates top views of the auxiliary electrodes of different examples, but not limited thereto. As an example (i) shown in FIG. 6, the auxiliary electrode 624 may be ring-shaped and include a second opening 624A. For example, an outline of the outer side of the auxiliary electrode 624 may be rectangular or other suitable geometric shapes, but not limited thereto. As an example (ii) shown in FIG. 6, the auxiliary electrode 724 may be mesh-shaped and include a plurality of second openings 724A. The shape of the second opening 724A may be for example rectangular or other suitable geometric shapes, but not limited thereto. As an example (iii) shown in FIG. 6, the auxiliary electrode 824 may be block-shaped and include no opening. In such situation, it is required to dispose the auxiliary electrode 824 on a side of the first electrode. As an example (iv) shown in FIG. 6, the auxiliary electrode 924 may include a plurality of second openings 924A, and the second opening 924A may for example be diamond-shaped or other suitable geometric shape. As an example (v) shown in FIG. 6, when the outline of the outer side of the auxiliary electrode 1024 is rectangular or other suitable geometric shapes, the second opening 1024A of the auxiliary electrode 1024 may be irregular shape. In such situation, the second opening 1124A may be for example geometric shape or irregular shape. In some embodiments, any one of the auxiliary electrode 624, the auxiliary electrode 724, the auxiliary electrode 824, the auxiliary electrode 924, the auxiliary electrode 1024, and the auxiliary electrode 1124 mentioned above may be adapted to any one of the embodiments or variant embodiments mentioned above. As viewed along the top view direction, in some embodiments, the example (i), the example (v), the example (vi) of FIG. 6 may replace the auxiliary electrode 24 shown in FIG. 1A, and the first electrode 20 and the second electrode 22 may be disposed in the second opening 624A, the second opening 1024A or the second opening 1124A, in which the difference between the auxiliary electrode of example (i) of FIG. 6 and the auxiliary electrode of FIG. 1A is the auxiliary electrode 624 may not be electrically connected to the second electrode 22 in the example (i) of FIG. 6. In some other embodiments, the first electrode 20 may be disposed in the second opening 624A, the second opening 1024A or the second opening 1124A. In more detail, the first electrode 20 or the second electrode 22 that is connected to the pad 44 or conductive material 46 may optionally be electrically connected to the auxiliary electrode 624, the auxiliary electrode 1024 or the auxiliary electrode 1124 or not, and when the light-emitting element is disposed on the substrate 12, the pad 44 or conductive material 46 of the light-emitting element may be connected to the first electrode 20 or the second electrode 22. During this process, the electrostatic charges may occur and be discharged through the second opening. In some embodiments, the shape of the auxiliary electrode or the arrangement of the second opening may be designed to avoid peripheral electronic element except for the light-emitting element and the thin-film transistor. For example, in the designs of the auxiliary electrodes of the example (v) and the example (vi) of FIG. 6, since the auxiliary electrode close to the peripheral electronic element except for the light-emitting element and the thin-film transistor, the auxiliary electrode may discharge the electrostatic charges generated in the process of manufacturing the peripheral electronic element. As viewed along the top view direction, in some embodiments, the example (i), the example (v), the example (vi) of FIG. 6 may replace the auxiliary electrode 324 shown in FIG. 3A and be partially overlapped with the first electrode 20. In other words, as viewed along the top view direction, at least a portion of the auxiliary electrode is overlapped with the first electrode 20, which may be regarded as partially overlapping. In some other embodiments, the auxiliary electrode 724 of the example (ii), the auxiliary electrode 824 of the example (iii) and the auxiliary electrode 924 of the example (iv) of FIG. 6 may be a portion of the auxiliary electrode 324 shown in FIG. 3A. For example, the auxiliary electrode 724 of the example (ii) of FIG. 6 and the auxiliary electrode 924 of the example (iv) of FIG. 6 may be a portion of the auxiliary electrode 324 shown in FIG. 3A, and the shape designs of the their openings may be arbitrary changed. In some other embodiments, the second opening 724A of the example (ii) of FIG. 6 and the second opening of the example (iv) of FIG. 6 may be through holes, and wires may penetrate through the through holes and through different layers based on design requirements. It is noted that the first electrode is close to the opening of the auxiliary electrode mentioned above, such that the minimum distance between the auxiliary electrode and the first electrode is less than the minimum distance between the auxiliary electrode and the second electrode.

In summary, in the electronic device of the present disclosure, by means of disposing the auxiliary electrode to be adjacent to the first electrode, the minimum distance between the first electrode and the auxiliary electrode may be less than the minimum distance between the first electrode and the common electrode, so that plenty of electrostatic charges flowing into the first electrode can be discharged to the common electrode with larger area. Thus, damage to the thin-film transistor by the ESD may be reduced, and the ESD protection of the electronic device is improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a substrate;
   a common electrode disposed on the substrate; and
   a plurality of pixels disposed on the substrate, at least one of the plurality of pixels comprising:
      a thin film transistor;
      a first electrode electrically connected to the thin film transistor;
      a second electrode; and
      an auxiliary electrode, wherein the auxiliary electrode is partially overlapped with the first electrode in a top view direction of the electronic device;
   wherein the auxiliary electrode is electrically connected to the common electrode and electrically isolated from the first electrode, and the first electrode and the auxiliary electrode have a minimum distance less than a minimum distance between the first electrode and the common electrode,
   wherein the minimum distance between the first electrode and the auxiliary electrode is less than a minimum distance between the first electrode and the second electrode.

2. The electronic device according to claim 1, wherein the auxiliary electrode comprises at least one second opening, and a size of the at least one second opening is less than an area of the first electrode.

3. The electronic device according to claim 1, wherein the at least one of the plurality of pixels comprises a wire, the auxiliary electrode is electrically connected to the common electrode through the wire, and the auxiliary electrode and the wire are formed in a same layer.

4. The electronic device according to claim 1, wherein a minimum distance between a source/drain of the thin-film transistor and the auxiliary electrode is less than the minimum distance between the auxiliary electrode and the first electrode.

5. The electronic device according to claim 1, wherein the second electrode and the common electrode are electrically connected to different voltages.

\* \* \* \* \*